United States Patent [19]

Pramanik et al.

[11] Patent Number: 5,399,533
[45] Date of Patent: Mar. 21, 1995

[54] METHOD IMPROVING INTEGRATED CIRCUIT PLANARIZATION DURING ETCHBACK

[75] Inventors: Dipankar Pramanik, Cupertino; Vivek Jain, Milpitas; Milind Weling, San Jose, all of Calif.

[73] Assignee: VLSI Technology, Inc., San Jose, Calif.

[21] Appl. No.: 161,642

[22] Filed: Dec. 1, 1993

[51] Int. Cl.$^6$ .............................. H01R 460; H01R 4/64
[52] U.S. Cl. ...................... 437/228; 437/195; 437/231
[58] Field of Search ................ 437/195, 228, 231; 156/643

[56] References Cited

U.S. PATENT DOCUMENTS

| | | | |
|---|---|---|---|
| 4,966,867 | 10/1990 | Croth et al. | 437/195 |
| 5,155,064 | 10/1992 | Mise | 437/195 |
| 5,310,692 | 5/1994 | Chan et al. | 437/231 |

OTHER PUBLICATIONS

JMFG van Laarhoven et al "A Novel Blanket W Etchback Scheme" IEEE VMIC Conference Jun. 12-13, 1989.

Primary Examiner—Brian E. Hearn
Assistant Examiner—Michael E. Russell
Attorney, Agent, or Firm—Flehr, Hohbach, Test, Albritton & Herbert

[57] ABSTRACT

An integrated circuit fabrication method begins with semiconductor devices formed on a substrate. A patterned metal layer is deposited on the substrate to connect the semiconductor devices. A nitride layer is deposited over the metal layer and substrate. The nitride layer topography comprises hills located over metal regions and valleys located over non-metal regions. Spin-on-glass (SOG) is deposited over the nitride layer, thereby filling the valleys and covering the hills. The SOG layer and the nitride layer hills are etched back at substantially the same etch rate, using plasma etching, to form a planar surface. An oxide layer is then deposited over the planar surface to encapsulate the semiconductor devices, metal layer, nitride layer and SOG layer. Vias may then be etched through the oxide layer and the nitride layer to expose portions of the underlying metal layer and facilitate upper layer metal connections thereto. A second metal layer is deposited on the oxide layer and the fabrication process continues until the integrated circuit is complete.

15 Claims, 3 Drawing Sheets

METHOD IMPROVING INTEGRATED CIRCUIT PLANARIZATION DURING ETCHBACK

FIELD OF THE INVENTION

The present invention relates generally to integrated circuit fabrication and particularly to a method of depositing layers of dielectric materials over semiconductor devices and conductors and then etching back the materials to prepare a surface for additional depositions of conductor and dielectric materials.

BACKGROUND OF THE INVENTION

Integrated Circuit (IC) fabrication generally begins by forming a number of semiconductor devices on a substrate, The semiconductor devices are next connected by a patterned conductor layer such as a metal layer. The semiconductor devices and metal layers are then covered by dielectric materials such as silicon dioxide and glass. Vias are etched to expose portions of the previous metal layers and new layers of metal and dielectric materials are deposited. This layering process continues until the IC is complete. IC fabrication is an area of considerable interest to the electronics industry because as fabrication techniques improve so do yield and device density.

Well known techniques currently provide methods for depositing IC materials layer by layer onto a substrate. Examples are Chemical Vapor Deposition (CVD), Plasma Enhanced Chemical Vapor Deposition (PECVD) and sputtering. CVD and PECVD provide for a material to be transported as a vapor to a surface and deposited thereon. Another example is spinning which involves placing an excess of material at a location on a surface and rotating the surface to distribute the material.

FIG. 1 depicts a cross section of a prior art IC 1 at an intermediate fabrication step. IC 1 is formed by taking a substrate 2 and depositing a patterned metal layer 3 connecting semiconductor devices on the substrate. The height of the patterned metal layer 3 results in an uneven topography. An oxide layer 4 is then deposited over the substrate 2 and the metal layer 3. The oxide is typically a tetra-ethyl-ortho-silicate (TEOS)-based oxide deposited using CVD or PECVD. This oxide layer is quite conformal to the underlying layers and thus forms hills in regions having metal thereunder and valleys in regions having no metal thereunder. This is simply a result of the underlying uneven topography. A thick spin-on-glass (SOG) layer 5 is then spun over the oxide layer to even out the topography.

The resulting IC 1 has a thick and reasonably planar surface layer of SOG 5. This surface must be etched back to remove all the SOG over the oxide layer hills prior to etching vias through the oxide to the underlying metal, thus permitting a future metal deposition to fill the via and contact the underlying metal. The reason for exposing the oxide layer hills is to avoid etching future vias through the SOG layer because SOG has poor stability. The etchback procedure is performed using plasma etching that is intended to cause the SOG and the oxide hills to be etched back at approximately the same rate. Etchback is a process known in the art and is performed using compounds such as $CHF_3$, $CF_4$, $C_2F_6$, $SF_6$ and combinations (i.e., mixtures) thereof.

Referring to FIG. 1, the desired etchback level is D. When the SOG layer and the oxide layer hills are etched back to level D, optimum IC characteristics are achieved. These characteristics include strong via construction, good planarization, no exposure of underlying metal during etchback, and controlled impedance between metal layers. If the SOG layer is etched back only to level D' there will be excess SOG present and the hills of the oxide layer will not be exposed. This will result in poor reliability of any vias that are etched down to the metal layer. If the SOG layer and oxide layer hills are etched back to level D'' the metal will be exposed. This will result in poor device reliability, poor impedance control and low IC yield.

A problem with current etch techniques is control of the etch rate. When the SOG layer is etched back and the hills of the oxide layer become exposed, oxygen is liberated from the oxide layer. Oxygen liberation occurs as a result of an interaction between the etch chemistry and the oxide layer. When the SOG layer is exposed to this liberated oxygen, the SOG layer etches faster than the oxide layer. The SOG layer etch rates are increased by as much as 100% due to the oxygen. The result is an uneven surface with too much SOG etched back.

Techniques have been developed for compensating for the oxygen accelerated etch of SOG. It is known in the prior art that making the etch rate for the TEOS-based oxide layer 4 about twice the etch rate for the SOG layer 5 can compensate for these etch effects. In practice, a typical etch rate for SOG might be 50 Å/second, whereas the etch rate for TEOS-based oxide is about 100 Å/second. However, as the oxide hill becomes exposed and oxygen is liberated, the SOG etch rate increases to about 100 Å/second. The result is that when the oxide hill is exposed, both the SOG and the oxide materials then etch at about the same rate. This compensation technique is not a solution to the etch rate effect problem but rather an adjustment for it.

FIG. 2 depicts a prior art IC 1 after etchback. The SOG layer surface 5 is uneven. Particularly, the SOG layer surface is lower in regions adjacent to oxide layer 4 hills due to the liberation of oxygen during etchback. In other words, the released oxygen accelerates SOG etching most near the sites where the oxygen is released. This phenomenon is known as "loading" or "microloading" to those skilled in the art. This phenomenon occurs even though the compensation techniques described above can minimize it.

The uneven planarization depicted in FIG. 2 creates an increasing problem as the demand for device density increases. For example, when the distance between metal traces is large, resulting in large distances between oxide hills, an acceptable planarization can be accomplished with current techniques discussed above. However, when the distance between metal traces is small, resulting in small distances between oxide hills, there is a tendency for too much of the SOG to be etched away thereby leaving a vacant valley between the oxide hills. The vacant valley causes additionally deposited materials to exhibit a similar valley located over the same region.

What is needed is a method of etching back layers of IC materials at a consistent rate. By etching back the different materials at a consistent rate, superior planarity is achieved. A planar surface directly promotes higher yield and permits greater device density.

The present invention provides such a method.

SUMMARY OF THE INVENTION

The present invention provides a method improving integrated circuit planarization during etchback. The preferred embodiment begins with a substrate having semiconductor devices formed thereon. A metal layer (or other interconnect layer such as polysilicon) is deposited on the substrate and is patterned and etched so as to connect the semiconductor devices. The patterned metal layer results in an uneven surface due to the steps created in the metal layer and in the underlying topography.

A nitride layer of silicon nitride (SIN) is deposited over the metal layer and substrate. This deposition is performed using a technique such as CVD, PECVD or sputtering. The result is a surface having hills and valleys. Hills are created over areas having metal thereunder and valleys are created over area having no metal thereunder. This is a result of the underlying uneven topography.

A SOG layer is deposited over the nitride layer. The SOG is spun onto the nitride surface. SOG fills the valleys in the nitride layer and creates a fairly thick and undulated layer over the entire nitride layer. The undulations are caused by the hills and valleys present in the nitride layer.

The SOG and the tops of the nitride hills are etched back using plasma etching with a compound such as $CHF_3$, $CF_4$, $C_2F_6$, $SF_6$ or a combination thereof. The etch chemistry is selected so that the etch rates of the SOG and the nitride hills are consistent and substantially equal. This consistent rate is achieved because the nitride does not liberate oxygen during etchback. The result is a planar surface.

An oxide layer is deposited over the planar surface of the SOG and exposed nitride hills. The oxide layer will also have a planar surface since it is deposited on a planar surface.

Vias may be etched through the oxide and the nitride to expose portions of the underlying first metal layer. A second metal layer may then be deposited over the oxide layer with metal filling the vias and contacting the first metal layer. The second metal layer is covered in the same manner as the first metal layer and the process continues until the IC is complete.

An advantage of the present method is that improved IC yield and reliability is achieved by the superior planarity of IC layers. A second advantage is that semiconductor density can be increased for two reasons: first, metal traces can be deposited closer to one another because SOG will not be excessively removed from the nitride valley between closely spaced traces. Other features and advantages of the present invention will appear from the following description in which the preferred embodiment has been set forth in detail, in conjunction with the accompanying drawings.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
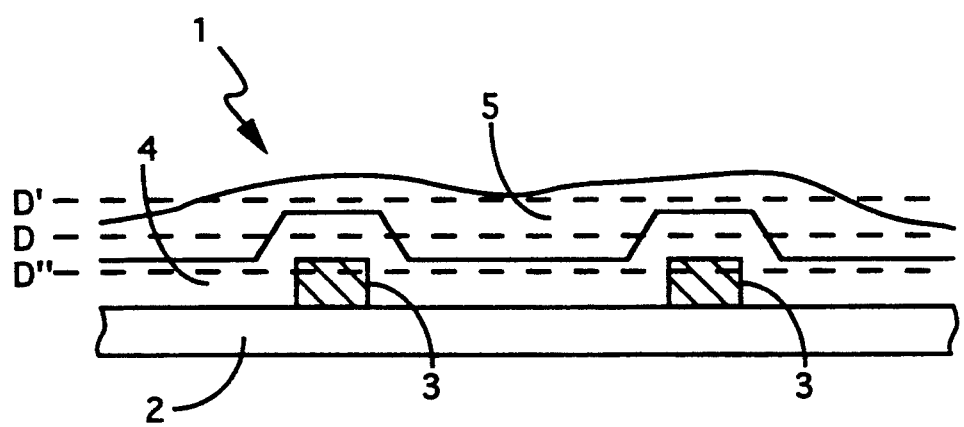
FIG. 1 depicts an IC in a fabrication step having a substrate, metal layer, oxide layer and glass layer, according to the prior art.
Figure 2:
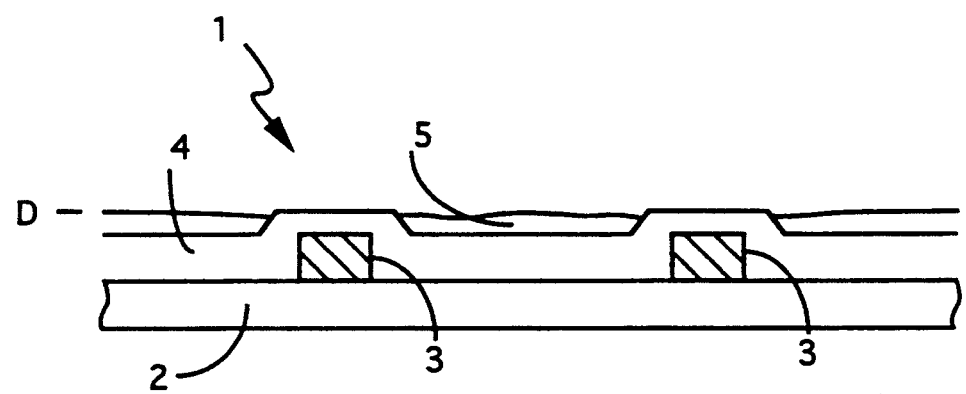
FIG. 2 depicts the IC of FIG. 1 after an etchback step, according to the prior art.
Figure 3:
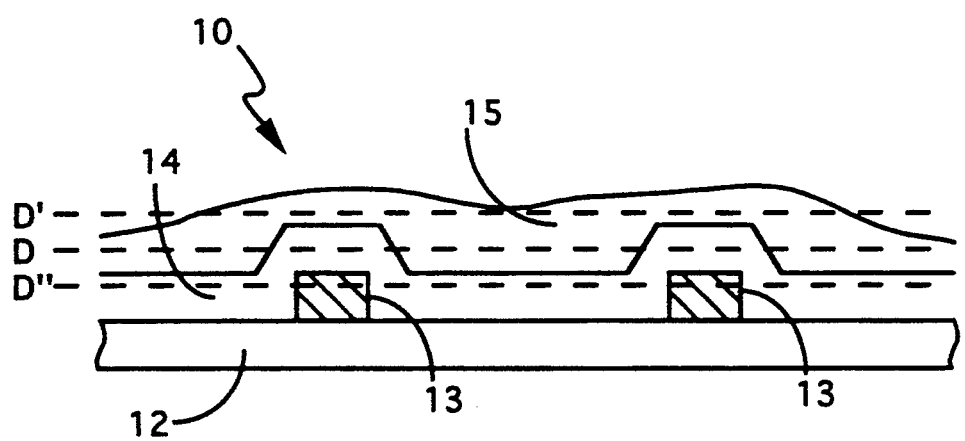
FIG. 3 depicts an IC in a fabrication step having a substrate, metal layer, nitride layer and glass layer.

FIG. 3 depicts a cross section of an integrated circuit (IC) 10 at an intermediate fabrication step. IC 10 comprises a substrate 12, patterned interconnect layer 13, nitride layer 14 and SOG layer 15. The patterned interconnect layer is generally metal, polysilicon or other low resistivity material. For purposes of describing the present invention, it is assumed that layer 13 is a patterned metal interconnect layer.

To construct IC 10 a number of semiconductor devices (not shown) are first formed on substrate 12. A patterned metal layer 13, is then deposited on substrate 12 to connect the semiconductor devices. Metal layer 13 is a metal layer having a thickness of about 5,000 Å to 7,000 Å.

Nitride layer 14 consists essentially of Silicon Nitride (SIN) and is deposited over substrate 12 and metal layer 13. Preferably, the nitride layer is deposited in a commercially available PECVD reactor at a temperature of about 400° C. and a pressure of about 2 Torr. Reactant gasses include a combination of silane ($SiH_4$), nitrous oxide ($N_2O$) and nitrogen ($N_2$). The nitride layer comprises hills over regions having metal thereunder and valleys having no metal thereunder. This is depicted in FIG. 3 where it can be seen that the nitride layer over the metal layer 13 approaches level D' while the nitride layer over the non-metal regions is closer to D". A deposited thickness of about 5,000 Å to 6,000 Å is desirable to adequately cover the surface and to allow for the etching back of about 1,000 Å to 3,000 Å of the nitride layer hills. More generally the deposited nitride layer should be at least 4,000 Å thick and preferably at least 5,000 Å thick.

SOG layer 15 is spun over nitride layer 14. The spinning causes the SOG to undulate over the nitride hills and valleys. The result is a thick SOG layer that fills the valleys and covers the hills on the nitride layer. This SOG layer preferably has a thickness of approximately 2,500 Å, to 3,500 Å over regions having flat topography and less of a thickness over regions having variations in topography. More generally the SOG layer should be at least 2,000 Å thick over flat regions of the wafer.

Etchback of the SOG layer and the nitride layer hills is performed using plasma etching. Plasma etchback is a well known technique for removing a specified depth of a sacrificial layer in order to planarize the surface. The preferred embodiment uses a combination of $CHF_3$, $CF_4$ and $C_2F_6$. A mixture of these compounds and $SF_6$ has also been found to work well for etching SiN. In the preferred embodiment, the etch rates of the SOG layer and the nitride layer can be set, by adjusting the plasma chemistry, to approximately 50 Å/second. This etch rate is good for controlling the etching process in order to etchback the material to the desired D line of FIG. 3.

In the preferred embodiment, the D line of FIG. 3 is approximately 3,000 Å above metal traces 13. In order to etchback to the D line of FIG. 3, an etch time is chosen that will etchback SOG layer 15 and nitride layer 14 to the D line. For example, if the deposited nitride thickness is 6,000 Å and the SOG thickness over flat topography regions is 3,000 Å, an etchback depth of 3,000 Å is desired. Therefore, since the etchback rate is about 50 Å/second, a 60 second etch time is adequate to etch the SOG layer and the nitride layer to the D line. This results in at least 3,000 Å of nitride over narrow metal traces, about 6,000 Å over flat topographies, and SOG filling the valleys of the nitride layer as depicted in FIG. 4.

Figure 4:
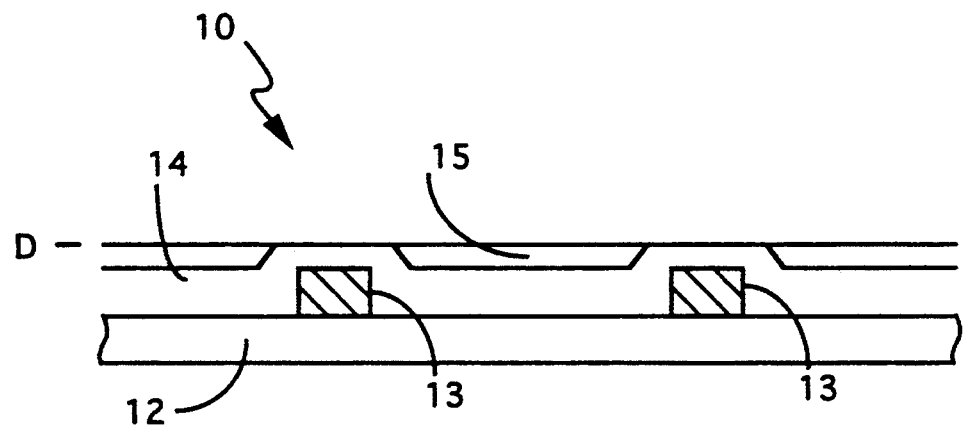
FIG. 4 depicts the IC of FIG. 3 after an etchback step.

FIG. 4 shows IC 10 after etchback. Since SOG layer 15 and nitride layer 14 are etched at the same rate, the resulting surface is planar.

Figure 5:
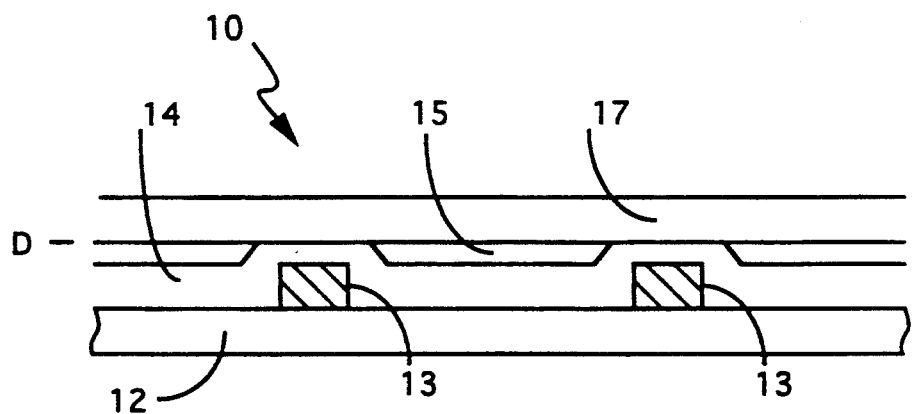
FIG. 5 depicts the IC of FIG. 4 having an oxide layer.

FIG. 5 depicts an oxide layer 17 deposited over the planar surface of SOG layer 15 and nitride layer 14. In the preferred embodiment a TEOS-based oxide is deposited on the planar surface in a commercially available PECVD reactor at a temperature of about 400° C. and a pressure of about 2 Torr. Reactant gasses include a combination of silane ($SiH_4$), nitrous oxide ($N_2O$) and nitrogen ($N_2$). A thickness of about 3,000 Å to 5,000 Å is desirable to adequately cap the surface and provide electrical isolation from other metal layers.

To obtain a multi-level integrated circuit, a second level of metal interconnect traces can be placed on the oxide layer 17 of FIG. 5. Further, a connection must be made to the first level for input and output signals. A connection is accomplished by first etching vias through oxide layer 17 and nitride layer 14 to expose portions of the underlying first metal layer 13. Via etching is typically performed first using an isotropic wet etch and then an anisotropic dry etch, concentrated only in the area where the via is desired.

Figure 6:
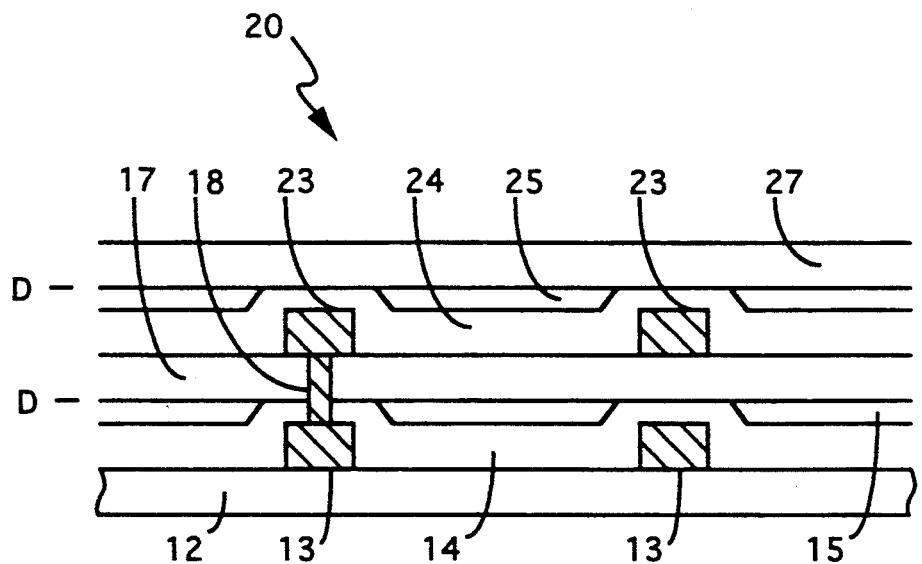
FIG. 6 depicts the IC of FIG. 5 having a second metal layer, nitride layer, glass layer, oxide layer and a via from the second metal layer to the first metal layer.

FIG. 6 depicts a two level IC 20. In addition to the same numbered elements from FIG. 5, FIG. 6 depicts a via 18, second metal layer 23, second nitride layer 24, second SOG layer 25 and second oxide layer 27. During fabrication of IC 20, vias are etched through oxide layer 17 and nitride layer 14 to expose portions of the first metal layer 13. As depicted in FIG. 6, via 18 is formed through the oxide layer and nitride layer only; there is no SOG between nitride layer 14 hill and oxide layer 17. Deposition of the second metal layer 23 fills via 18 (and others, not shown) with metal contacting first metal layer 13. After metal layer 23 is deposited and patterned, nitride layer 24, SOG layer 24 and oxide layer 27 are deposited in the same manner as in the first level.

Connecting metal layers is an important feature of IC fabrication because it permits three dimensional IC interconnect design. In the present invention, the vias that permit the connections are strong and reliable due to the superior planarity of the layers. This planarity distributes stress more evenly than prior designs and therefore promotes a higher yield of properly functioning ICs. Also, since the vias are strong and reliable, an improvement in semiconductor device density is realized because spacing between vias and devices can be reduced. This complements the feature that metal traces can be moved closer together due to the stability achieved in the SOG etch.

ALTERNATE EMBODIMENTS

Figure 7:
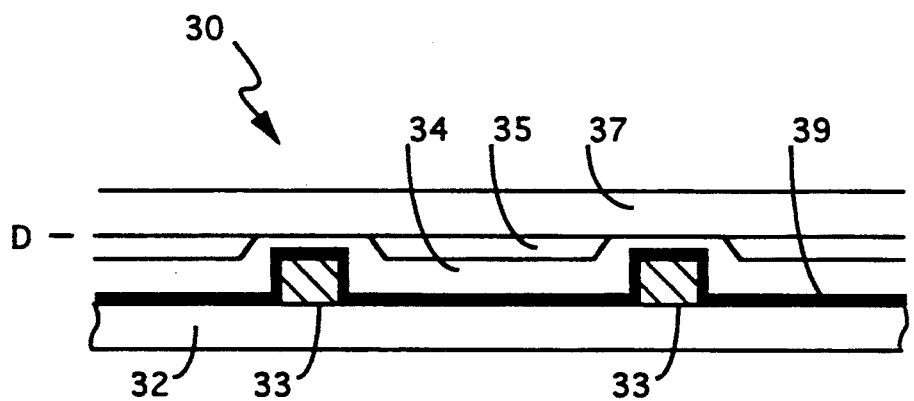
FIG. 7 depicts an alternate embodiment having a substrate, metal layer, silicon rich oxide layer, nitride layer, glass layer and oxide layer.

FIG. 7 depicts an alternate embodiment 30 comprising a substrate 32, metal layer 33, silicon rich oxide layer 39, nitride layer 34, SOG layer 35 and oxide layer 37. The silicon rich oxide is non-stoichiometric, e.g., $SiO_x$ where $x<2$.

Silicon rich oxide layer 39 is deposited using CVD or PECVD to a thickness of approximately 1,000 Å, to 2,000 Å or more. Because the silicon rich oxide layer is relatively thin, it advantageously does not fill much of the valley between patterned metal traces 33. Thus, the deposition of nitride layer 34 and SOG layer 35 are not significantly affected.

In this alternate embodiment, silicon rich oxide layer 39 is formed below the optimum etchback D line of FIG. 7. Thus, a properly controlled etchback will not expose the silicon rich oxide. However, if the etchback inadvertently etches too deep, a planar surface will still be achieved. Because silicon rich oxide layer 39 does not have as much oxygen as a stoichiometric oxide and is also different in its chemical nature, it does not liberate as much oxygen during etchback as would a stoichiometric oxide. Therefore, if the etchback progresses through the SOG layer, the nitride layer hills and into the silicon rich oxide, the silicon rich oxide will liberate little oxygen and the SOG layer will continue to etch evenly. The result will be a planar surface.

Other alternate embodiments can be made by varying the thickness of the materials specified in the preferred embodiment and alternate embodiment. Still other alternate embodiments can be made by varying the IC material application techniques specified in the preferred embodiment.

Modifications and variations may be made to the disclosed embodiments without departing from the subject and spirit of the invention as defined by the following claims.

What is claimed is:

1. A method of manufacturing an integrated circuit, on a substrate, comprising the steps of:
   depositing a patterned metal layer on said substrate; and
   fabricating a dielectric cover over the patterned metal layer, comprising the steps of:
      depositing a nitride layer, absent sufficient oxygen to cause liberation of oxygen during etchback, over said substrate and the patterned metal layer, wherein the nitride layer is deposited in such manner to create hills in the nitride layer having metal thereunder and valleys in the nitride layer having no metal thereunder;
      depositing a spin on glass (SOG) layer on the nitride layer thereby predominantly filling the valleys in the nitride layer;
      etching back the SOG layer and the hills of the nitride layer to create a substantially planar surface; and
      depositing an oxide layer on the substantially planar surface resulting in a substantially planar oxide layer.

2. The method of claim 1, wherein the nitride layer consists essentially of silicon nitride and the oxide layer consists essentially of TEOS-based oxide.

3. The method of claim 1, wherein said step of etching back the nitride layer and the SOG layer is performed using a gas selected from the group consisting of $CHF_3$, $CF_4$, $C_2F_6$, $SF_6$ and combinations thereof, 4. The method of claim 1, wherein said step of depositing a nitride layer is carried out by forming the nitride layer to a thickness in the approximate range of 5,000 Å to 6,000 Å.

5. The method of claim 1, wherein said step of depositing a SOG layer is carried out by forming the SOG layer to a thickness in the approximate range of at least 2,000 Å, over flat regions of the nitride layer.

6. The method of claim 1, wherein said step of depositing a SOG layer is carried out by forming the SOG layer to a thickness in the approximate range of 2,500 Å to 3,500 Å, over flat regions of the nitride layer.

7. The method of claim 1, further comprising the steps of:
- etching vias through the oxide layer and the nitride layer to expose portions of the patterned metal layer deposited on the substrate;
- depositing a patterned metal layer on the oxide layer, wherein portions of the patterned metal layer deposited on the oxide fill the vias and contact the exposed portions of the patterned metal layer deposited on the substrate;
- again performing said fabricating steps to fabricate a dielectric cover over the patterned metal layer deposited on the oxide.

8. The method of claim 1, wherein:
- said step of depositing a nitride layer is preceded by a step of depositing a silicon rich oxide layer over said substrate and the patterned metal layer, wherein the silicon rich oxide layer is deposited in such manner to create hills in the silicon rich oxide layer having metal thereunder and valleys in the silicon rich oxide layer having no metal thereunder.

9. The method of claim 8, wherein the nitride layer consists essentially of silicon nitride and the oxide layer consists essentially of TEOS-based oxide.

10. The method of claim 8, wherein said step of etching back the nitride layer and the SOG layer is performed using a gas selected from the group consisting of CHF$_3$, CF$_4$, C$_2$F$_6$, SF$_6$ and combinations thereof.

11. The method of claim 8, wherein said step of depositing a silicon rich oxide layer is carried out by forming the silicon rich oxide layer to a thickness in the approximate range of 1,000 Å to 2,000 Å.

12. The method of claim 8, wherein said step of depositing a nitride layer is carried out by forming the nitride layer to a thickness in the approximate range of 5,000 Å to 6,000 Å.

13. The method of claim 8, wherein said step of depositing a SOG layer is carried out by forming the SOG layer to a thickness in the approximate range of at least 2,000 Å over flat regions of the nitride layer.

14. The method of claim 8, wherein said step of depositing a SOG layer is carried out by forming the SOG layer to a thickness in the approximate range of 2,500 Å to 3,500 Å over flat regions of the nitride layer.

15. The method of claim 8, further comprising the steps of:
- etching vias through the oxide layer, the nitride layer and the silicon rich oxide layer to expose portions of the patterned metal layer deposited on the substrate;
- depositing a patterned metal layer on the oxide layer, wherein portions of the patterned metal layer deposited on the oxide fill the vias and contact the exposed portions of the patterned metal layer deposited on the substrate;
- again performing said fabricating steps to fabricate a dielectric cover over the patterned metal layer deposited on the oxide.

* * * * *